United States Patent

Gunther et al.

[11] Patent Number: 6,065,614
[45] Date of Patent: May 23, 2000

[54] MODULE SUPPORT STRUCTURE

[75] Inventors: Hans-Ulrich Gunther, Pfinztal; Paul Mazura, Karlsbad; Volker Haag, Bad Wildbad; Klaus Pfeifer, Karlsruhe; Klaus-Michael Thalau, Malsch; Michael Joist, Gaggenau; Udo Weiss, Straubenhardt, all of Germany

[73] Assignee: Schroff GmbH, Straubenhardt, Germany

[21] Appl. No.: 08/957,451

[22] Filed: Oct. 24, 1997

[30] Foreign Application Priority Data

Oct. 25, 1996 [DE] Germany .......................... 196 44 419

[51] Int. Cl.[7] ................................................... H05K 7/14
[52] U.S. Cl. ..................... 211/41.17; 411/399; 411/187
[58] Field of Search .................................. 211/41.17, 26; 411/399, 187, 188, 185, 371, 387; 312/265.4

[56] References Cited

U.S. PATENT DOCUMENTS

| | | | |
|---|---|---|---|
| 378,857 | 2/1888 | Woodford | 411/399 X |
| 782,571 | 2/1905 | Lang | 411/399 X |
| 1,821,709 | 9/1931 | Hoerr et al. | 411/399 X |
| 3,145,362 | 8/1964 | Kleven | 411/399 X |
| 3,465,891 | 9/1969 | De Rose | 211/41.17 |
| 4,228,723 | 10/1980 | Cunningham | 411/399 X |
| 4,462,730 | 7/1984 | Knohl | 411/371 |
| 4,764,066 | 8/1988 | Terrell et al. | 411/187 |
| 4,779,326 | 10/1988 | Ickikawa | 411/187 X |
| 5,098,240 | 3/1992 | Gapp et al. | 411/424 |
| 5,165,770 | 11/1992 | Hahn | 312/265.4 |
| 5,356,253 | 10/1994 | Whitesell | 411/399 X |
| 5,487,633 | 1/1996 | Roberts | 411/387 |
| 5,622,464 | 4/1997 | Dill et al. | 411/387 X |

FOREIGN PATENT DOCUMENTS

| | | |
|---|---|---|
| 63353/94 | 1/1995 | Australia . |
| 0 268 961 A1 | 6/1988 | European Pat. Off. . |
| 32 41 066 A1 | 5/1984 | Germany . |

*Primary Examiner*—Daniel P. Stodola
*Assistant Examiner*—Khoa Tran
*Attorney, Agent, or Firm*—Merchant & Gould P.C.

[57] ABSTRACT

A module support structure is proposed for printed circuit boards which can be inserted on guide rails. The four parallel module rails of the module support structure to which the guide rails are mounted are connected to the two parallel side walls via a special mounting technique. Specially shaped mounting bolts are used with a head bolt having a flat seating surface, a substantially cylindrical threaded shaft, as well as a transition piece disposed between the bolt head and the threaded shaft and tapering in a conical manner towards the threaded shaft. The mounting bolts are fed through cylindrical mounting holes in the module rails. During tightening, the transition piece abuts against the outer edge of the mounting holes to force the module rails against the projections disposed above or below the mounting holes. In this manner, an exact positioning of the module rails relative to the side walls is necessarily effected. The outer edge of each mounting hole can be deformed by the transition piece until the seating surface of the corresponding bolt head seats on the side wall.

1 Claim, 3 Drawing Sheets

MODULE SUPPORT STRUCTURE

BACKGROUND OF THE INVENTION

The invention concerns a module support structure for printed circuit boards which can be inserted on guide rails, having two parallel side walls and at least four parallel module rails to which the guide rails can be mounted. The module rails comprise a cylindrical hole at each end for accepting a mounting bolt and the side walls have mounting holes for the mounting bolts and projections for positioning the module rails.

An exact guiding of the printed circuit board in the guide rails of a module support structure is clearly imperative, in particular for electronics applications in which multi-poled plugs of the smallest dimensions are used. The precise alignment of the guide rails depends, however, definitively on the precise, in particular vertical, positioning of the module rails on the side walls of the module support structure.

The side walls of conventional module support structures have inwardly directed projections, disposed at a particular separation above or below the mounting holes for the module rails. These projections function as positioning aids when mounting the module rails to the side walls. The module rails are positioned on the projections and the mounting bolts are then passed through the mounting holes of the side walls into the cylindrical holes of the module rails provided therefor.

For assembly or manufacturing purposes, the mounting holes in the side walls have an inner diameter which is significantly larger than the outer diameter of the mounting bolts. A displacement of the module rails perpendicular to the screw axis is therefore possible even when the mounting bolt seats in the mounting hole.

Problems thereby result, since the manual dexterity of the individual assembler determines whether or not the module rails actually seat on the corresponding projections after tightening the mounting bolts. Moreover, the module rails tend to rotate along with the mounting bolts when same are tightened.

As a result, in accordance with the described prior art, the close assembly tolerances necessary for the positioning of the guide rails for various applications can not be achieved or can only be achieved with an unacceptable degree of manual difficulty.

In order to achieve a restricted guidance seating of the module rails on the projections when tightening the mounting bolts, it has also been proposed that the mounting holes be countersunk in the outer side of the side walls and that beveled head bolts be used as mounting bolts.

However, this approach also has problems since, in this case as well, the inside diameter of the mounting holes is larger than the outer diameter of the threaded shaft of the mounting bolts. Consequently, the beveled head of a mounting bolt does not seat in the countersunk mounting hole at all sides, rather only at an upper section thereof, when the module rail is positioned on the projection. The frictional connection between the mounting bolts and the side wall is therefore unsatisfactory and causes concern that fatigue effects occur after longer periods of time. Moreover, the countersinking of the mounting holes in the side walls is very difficult from a manufacturing point of view.

SUMMARY OF THE INVENTION

It is therefore the underlying purpose of the invention to propose a module support structure comprising a new kind of bolt connection between the module support and the side components. The bolt connection should facilitate the maintenance of close installation tolerances in a simple fashion while nevertheless being capable of bearing high loads and being stable over a long period of time.

In accordance with the invention, a conventional module support structure of the above mentioned kind is therefore equipped with special mounting bolts consisting essentially of a bolt head having a flat seating surface and an essentially cylindrical threaded shaft. A conical transition piece is disposed between the bolt head and the threaded shaft which tapers from the bolt head towards the threaded shaft. In addition, the dimensional configuration of the cylindrical holes in the ends of the module rails, of the mounting holes in the side walls, as well as of the projections is such that, when tightening the mounting bolts, their transition piece abuts against the outer edge of the mounting holes to direct the module rail against the projection via the thereby resulting reaction force.

The final frictional connection between a mounting bolt and the associated side wall results when the seating surface of the bolt head seats on the outer side of the side wall when the mounting bolt is tightened. The frictional connection therefore acts around all sides of the mounting hole. The invention thereby combines the advantages of a bolt connection via a cylindrical head bolt with those of a bolt connection via beveled head bolts, while avoiding the associated disadvantages of each. Moreover, a force component remains which permanently presses the module rail against the projection so that there is no danger that the module rail twists when the mounting bolt is tightened down.

Particular advantages result when the materials of the mounting bolts and the side walls are adapted to each other in such a manner that, when the mounting bolts are screwed-in, an irreversible deformation of the outer edge of the mounting hole begins to occur when the module rail seats on the associated projection and the transition piece integrated into the mounting bolt abuts against the outer edge of the mounting hole. Due to the abutting conical transition piece, the mounting bolt, and along with it, the module rail, is then moved towards the projection during tightening. This motion ends when the module rail seats on the projection. Further tightening of the mounting bolt causes deformation of the outer edge of the mounting hole so that the contact surface between the mounting bolt and the inside of the mounting hole is increased. A force component in the direction of the projection thereby acts on the module rail. When the seating surface of the bolt head finally seats on the outer side of the side wall, the screwing-in torque sharply increases to establish the frictional connection between the module rail and the side wall. The force transfer surface not only comprises the deformed inside of the mounting hole, rather moreover the contact surface, surrounding the mounting hole, between the side wall and the bolt head.

In order to effect electrical contact between the module rails and the side walls of the module support structure, it is advantageous when the mounting bolts have a plurality of contact spikes on the seating surface of their bolt heads which penetrate through the oxide layer of the side walls when the bolts are tightened. The contact spikes are preferentially triangular pyramids disposed in a barb-shaped fashion.

The effect in accordance with the invention of the specially shaped mounting bolts is preferentially achieved with a conical transition piece having a countersunk angle of about 60 angular degrees.

An embodiment of the invention is more closely described below with reference to the associated drawings.

DESCRIPTION OF THE PREFERRED EMBODIMENT

Figure 1:
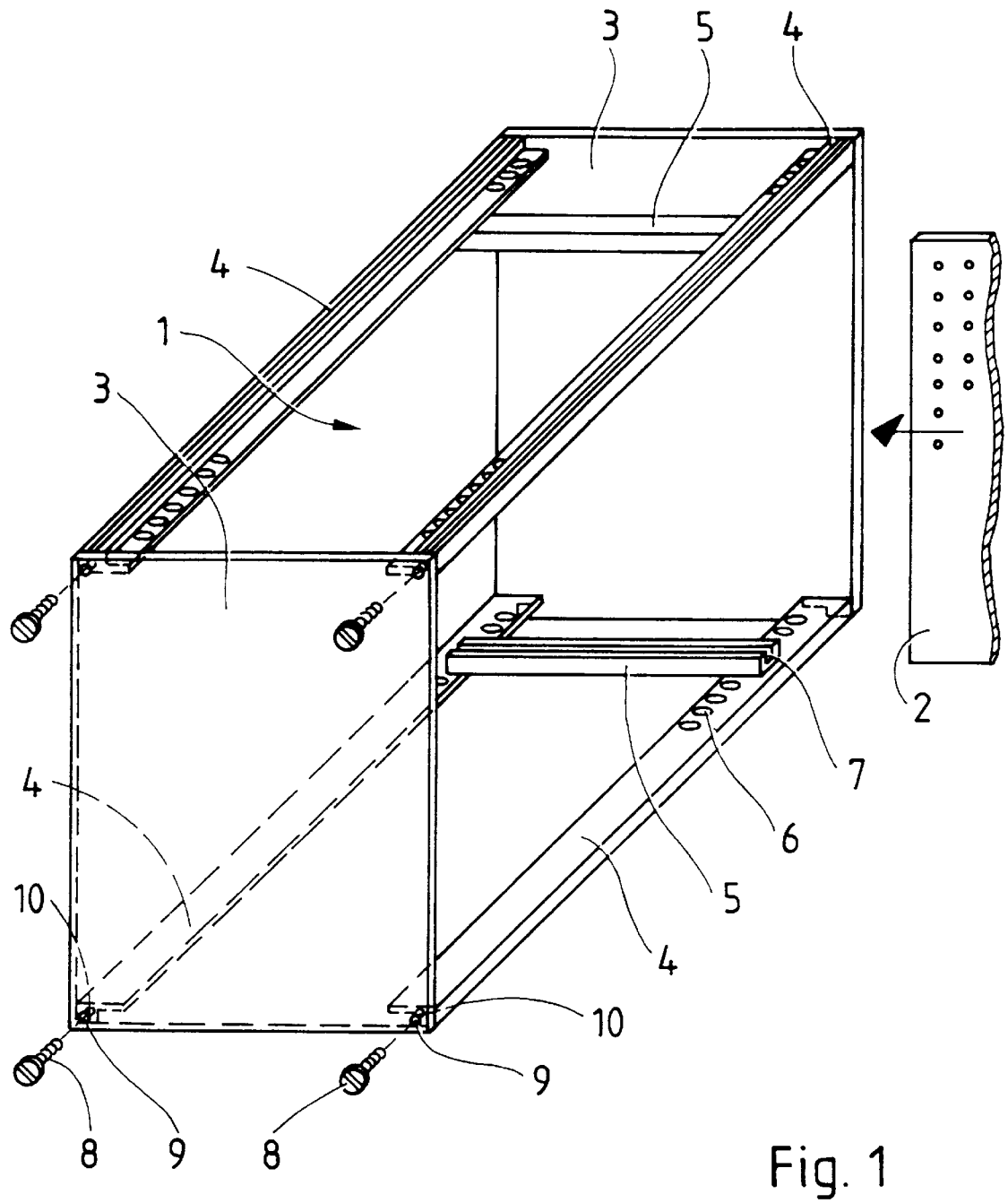
FIG. 1 shows a schematic perspective representation of a module support structure.

The module support structure 1 shown in FIG. 1 is intended to accept a large number of printed circuit boards 2, which are adapted for insertion and equipped with electrical and electronic components (not shown). The module support structure 1 consists essentially of two rectangular, parallel side walls 3 and four parallel module rails 4.

The four module rails 4, made from extruded aluminum, connect the two side walls 3. The two lower module rails 4 as well as the two upper module rails 4 each support an upper and lower guide rail 5, respectively. These guide rails 5 are mounted transverse to the module rails 4 using resilient clamping elements. The clamping elements snap into slotted holes 6 for equidistant disposition of the module rails 4. The guide rails 5 are made from molded plastic and each have a guide groove 7 for accepting the printed circuit boards 2.

The module rails 4 are mounted to the side walls 3 using mounting bolts 8. The mounting bolts 8 pass through associated mounting holes 9 in the side walls 3 and are screwed into cylindrical holes 10 in the module rails 4.

Figure 2A:
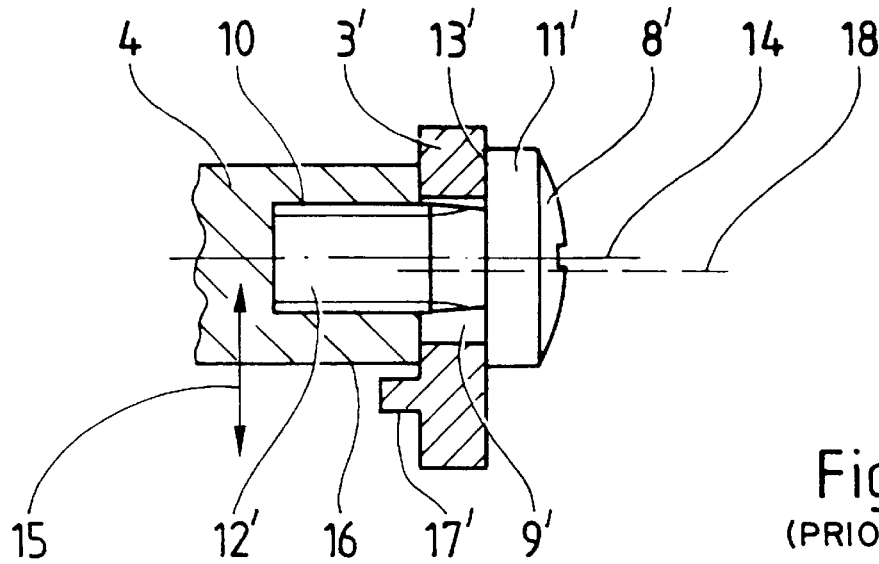
FIG. 2a schematically shows the mounting of a module rail to a side wall according to prior art.
Figure 2B:
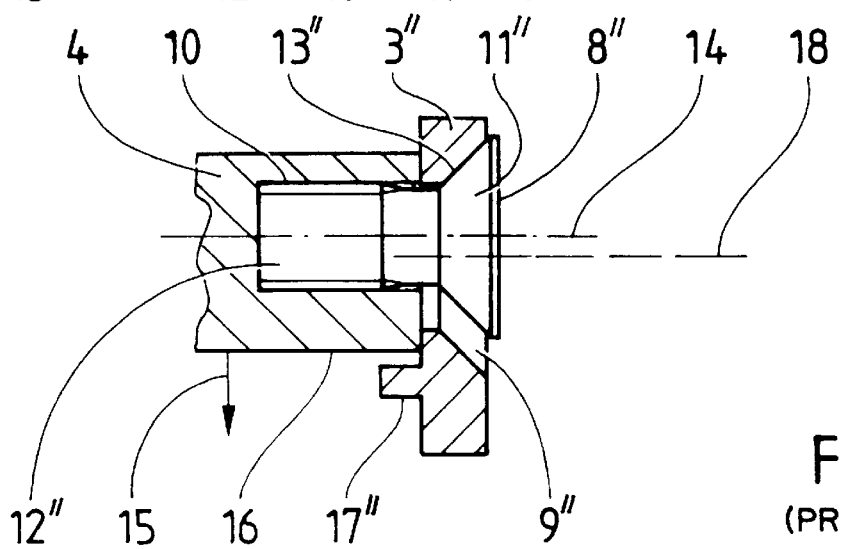
FIG. 2b schematically shows the mounting of a module rail to a side wall according to a different prior art.
Figure 2C:
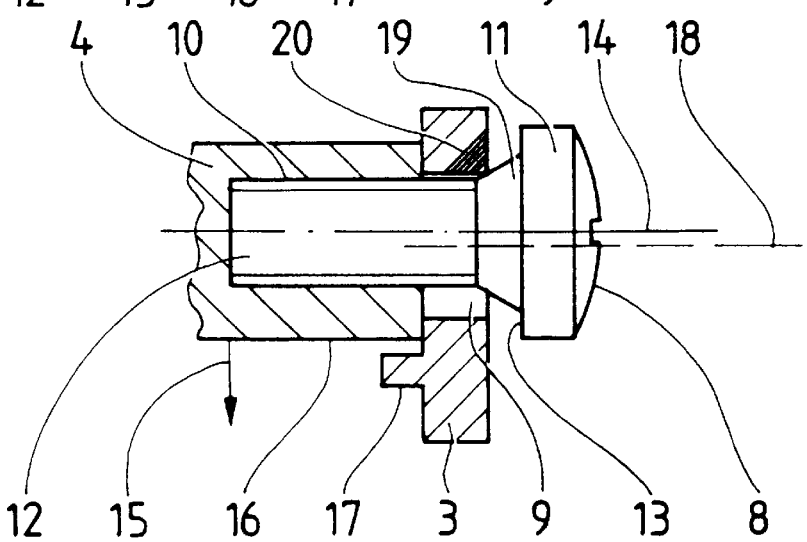
FIG. 2c schematically shows the mounting of the module rail in accordance with the invention to a side wall.

FIGS. 2a, 2b, 2c show:, in detail, the connection between the module rails 4 and the side walls 3 using the mounting bolts 8, 8' and 8". FIGS. 2a and 2b are taken from prior art and FIG. 2c shows the mounting technique in accordance with the invention.

FIG. 2a illustrates common prior art, wherein a mounting bolt 8', having a cylindrical bolt head 11', is screwed through a mounting hole 9' in the side wall 3' into a cylindrical hole 10 in the module rail 4. The cylindrical threaded shaft 12' of the mounting bolt 8' extends in a cylindrical manner up to the bolt head 11' seating surface 13'. The outer diameter of the threaded shaft 12' is, for assembly or manufacturing reasons, smaller than the inner diameter of the mounting hole 9', so that the actual axis 14 of the mounting bolt 8' can be displaced, in particular in the directions indicated by the arrow having reference number 15. The lower edge 16 of the module rail 4 must seat on the projection 17' provided therefor to effect an exact positioning of the module rail 4 on the side wall 3', particularly in the vertical direction. The person assembling the module support structure 1 must therefore take care, when tightening down the mounting bolt 8', that the actual axis 14 coincides with the desired axis 18. At the same time, the module rails 4 must not be rotated by the torque applied to the mounting bolt 8'.

FIG. 2b shows a configuration for mounting a module rail 4 to a side wall 3" which is sometimes used in prior art. In this case, the mounting bolt 8" is a beveled head bolt having a cylindrical threaded shaft 12" which is screwed through a mounting hole 9" in the side wall 3 into a cylindrical hole 10 in the module rail 4. The mounting hole 9" must be countersunk for acceptance of the bolt head 11" of the mounting bolt 8". In this case as well, the lower edge 16 of the module rail 4 must seat on the projection 17" of the side wall 3" to guarantee an exact alignment of the module rail 4. However, in accordance with the prior art as shown here, the screwing-in of the mounting bolt 8" causes, through the cooperation between the bolt head 11 and the countersink of the mounting hole 9", a forced guiding of the module rail 4 in the direction of arrow 15 until it seats on projection 17". Therefore the installer must not take particular care that the actual axis 14 and the desired axis 18 coincide.

However, as clearly shown in FIG. 2b, the use of a beveled head screw in conjunction with the countersunk mounting holes 9" causes the force transfer surface between the module rail 4 and the side wall 3 to be limited to the upper portion of the seating surface 13" of the bolt head 11". In most cases, the seating surface 13" only contacts the countersunk mounting hole 9" within a small angular region of its periphery. This significantly reduces the stability and load capability of the connection shown.

FIG. 2c shows the connection between a module rail 4 and a side wall 3 in accordance with the invention using a specially formed mounting bolt 8. The mounting bolt 8 consists essentially of a cylindrical bolt head 11 and an adjacent transition piece 19 which tapers in a conical manner towards the cylindrical threaded shaft 12. The mounting hole 9 in the side wall 3 is cylindrical in shape. Its inner diameter is larger than the outer diameter of the threaded shaft 12.

The mounting bolt 8 is initially screwed, without substantial resistance, into the cylindrical hole 10 of the module rail 4 along the actual axis 14. As soon as the transition piece 19 abuts with the inner edge of the mounting hole 9, a forced movement of the module rail 4 in the direction of arrow 15 results. When the lower edge 16 of the module rail 4 seats on the projection 17, and the actual axis 14 coincides with the desired axis 18, the screw-in torque of the mounting bolt 8 increases sharply. However at this time, the seating surface 13 of the bolt head 11 does not yet seat on the outer side of the side wall 3: the mounting bolt 8 can be tightened somewhat further. This tightening motion causes the inner edge of the mounting hole 9 to deform irreversibly in deformation region 20, to increase the connection surface between the inside of the mounting hole 9 and the outer side of the transition piece 19. This process continues until the seating surface 13 of the bolt head 11 seats at all sides on the region of the side wall 3 surrounding the mounting hole 9 to effect the permanent frictional connection between the module rail 4 and the side wall 3. Even after the mounting bolt 8 is completely tightened, a force component remains which acts on the module rail 4 in the direction of arrow 15 so that the exact alignment of the module rail 4 is guaranteed even when strongly loaded, e.g. with a heavy inserted printed circuit board 2 and/or in the event of vibrations and shaking.

Figure 3:
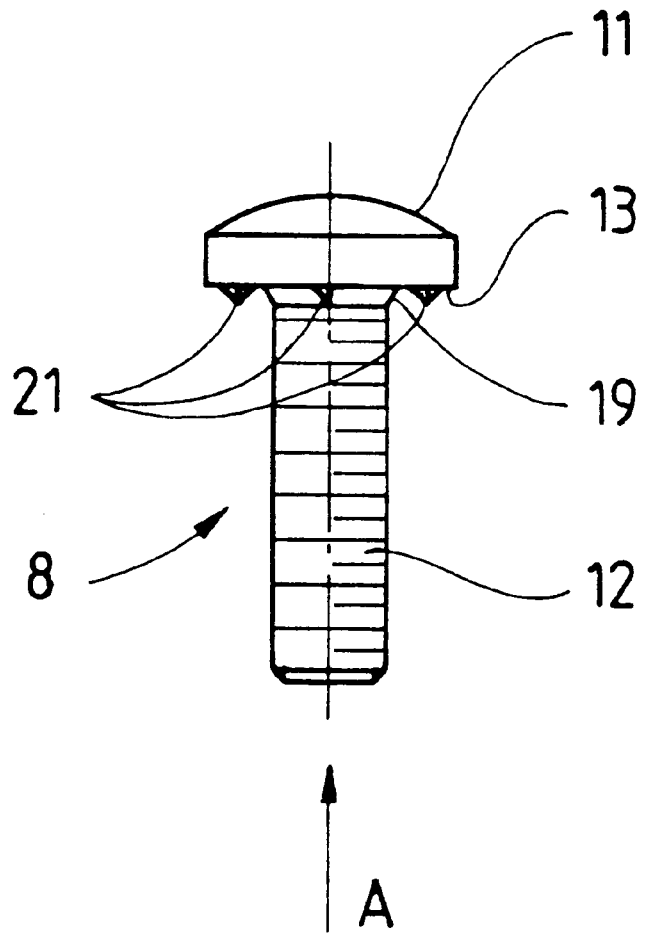
FIG. 3 shows a mounting bolt formed in accordance with the invention.

FIG. 3 shows, to scale, a mounting bolt 8 configured in accordance with the invention. The half-round basically cylindrically-shaped bolt head 11 is connected to the cylindrical threaded shaft 12 via the conical transition piece 19. The seating surface 13 of the bolt head 11 supports contact spikes 21 disposed in a barbed-shaped manner to guarantee contact between the mounting bolt 8 and a side wall 3, even through an oxide layer.

Figure 4:
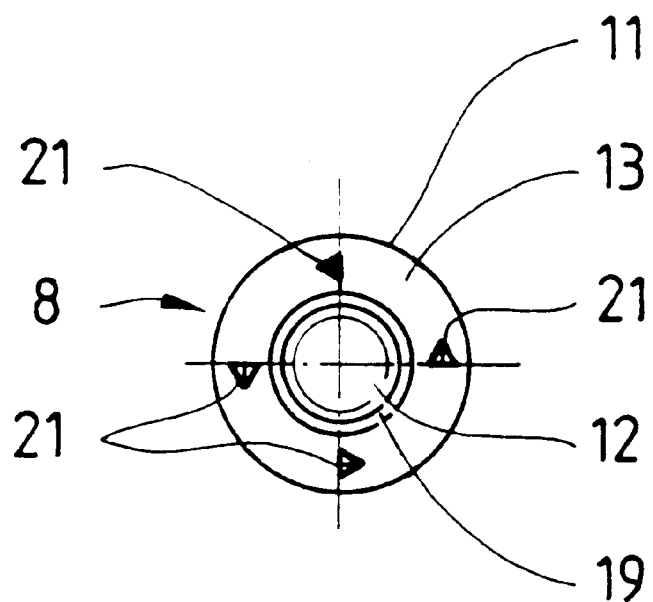
FIG. 4 shows a view in direction A of FIG. 3.

FIG. 4 shows the mounting bolt 8 of FIG. 3 in a view from direction A. In addition to the threaded shaft 12, the transition piece 19, and the seating surface 13 of the bolt head 11, one clearly sees that a total of four contact spikes 21 are disposed on the seating surface 13 at mutually spaced angles of 90 degrees. The barbed-shape of the contact spikes 21 has the advantageous side effect that the mounting bolts 8 do not loosen as easily under vibration and shaking.

SUMMARY OF REFERENCE SYMBOLS

1 module support structure
2 printed circuit board
3 side walls
4 module rails
5 guide rails
6 slotted hole
7 guide groove
8 mounting bolts
9 mounting holes (in 3)
10 holes (in 4)
11 bolt head
12 threaded shaft
13 seating surface (of 11)
14 actual axis (of 8)
15 arrow
16 lower edge (of 4)
17 projections
18 desired axis (of 8)
19 transition piece (of 8)
20 deformation region (of 3)
21 contact spikes

What is claimed is:

1. A module support structure for printed circuit boards which can be inserted on guide rails, comprising:

at least four parallel module rails to which the guide rails can be mounted, said module rails each having a threaded cylindrical hole at each end thereof;

a plurality of mounting bolts, each mounting bolt having a substantially cylindrical threaded shaft for screwed engagement into said threaded cylindrical hole, said threaded shaft having an outside thread diameter, each of said mounting bolts comprising a bolt head with a flat seating surface having a seating surface diameter and extending substantially perpendicular to said shaft and having a tapered section disposed between said flat seating surface and said shaft and tapering conically towards said shaft, said tapered section having a first end adjacent said flat seating surface having a first diameter and a second end adjacent said shaft having a second diameter, said first diameter being smaller that said seating surface diameter and greater than said second diameter, said second diameter substantially equal to said outside thread diameter, said tapered section having a length given by an axial separation between said first end and said second end; and two parallel side walls each having a side wall thickness and each having cylindrical through holes having a through hole diameter, said side wall thickness being greater than said tapered section length and said through hole diameter being greater than said outside thread diameter and less than said first tapered section diameter, wherein said tapered section engages an outer edge of said through hole and axial movement of said mounting bolt shifts said module rail relative to said side wall and deforms an outer edge of said through hole when said mounting bolt is tightened, to abut said seating surface on an outside surface of said side wall.

\* \* \* \* \*